United States Patent [19]
Ishida et al.

[11] Patent Number: 6,020,561
[45] Date of Patent: *Feb. 1, 2000

[54] PRINTED CIRCUIT SUBSTRATE WITH SOLDER FORMED ON PAD-ON-VIA AND PAD-OFF-VIA CONTACTS THEREOF

[75] Inventors: Kenzo Ishida; Yohko Mashimoto, both of Ibaraki; Kinya Ichikawa, Chiba, all of Japan

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/745,470

[22] Filed: Nov. 12, 1996

Related U.S. Application Data

[62] Division of application No. 08/623,676, Mar. 29, 1996, Pat. No. 5,660,321.

[51] Int. Cl.[7] .................................................. H01R 9/09
[52] U.S. Cl. .................... 174/261; 174/263; 228/180.22; 361/777; 361/774
[58] Field of Search ..................... 174/261, 262, 174/263, 260; 361/774, 777, 779; 257/737, 738, 723, 724, 780, 778; 228/180.22; 438/612, 613

[56] References Cited

U.S. PATENT DOCUMENTS

| | | | |
|---|---|---|---|
| 3,458,925 | 8/1969 | Napier et al. | 438/613 |
| 4,764,804 | 8/1988 | Sahara et al. | 257/717 |
| 5,214,308 | 5/1993 | Nishiguchi et al. | 257/692 |
| 5,255,839 | 10/1993 | da Costa Alves et al. | 228/180.21 |
| 5,261,593 | 11/1993 | Casson et al. | 228/180.22 |
| 5,400,950 | 3/1995 | Myers et al. | 228/180.22 |
| 5,489,750 | 2/1996 | Sakemi et al. | 174/261 |
| 5,493,075 | 2/1996 | Chong et al. | 174/261 |
| 5,521,435 | 5/1996 | Mizukoshi | 257/698 |
| 5,591,941 | 1/1997 | Acocella et al. | 174/266 |

FOREIGN PATENT DOCUMENTS

| | | |
|---|---|---|
| 0 263 944 | 8/1987 | European Pat. Off. . |
| 0 499 079 | 1/1992 | European Pat. Off. . |

*Primary Examiner*—Kristine Kincaid
*Assistant Examiner*—Kamand Cuneo
*Attorney, Agent, or Firm*—Blakely, Sokoloff, Taylor & Zafman LLP

[57] ABSTRACT

A printed circuit substrate having solder bumps formed on pad-on-via contacts and pad-off-via contacts. The printed circuit substrate has at least one pad-on-via contact and at least one pad-off-via contact. A first solder bump is on the pad-on-via contact and a second solder bump is on the pad-off-via contact. The first and second solder bumps are substantially the same height as measured above a horizontal plane that is substantially co-planar to the pad-off-via contact.

4 Claims, 7 Drawing Sheets

PRINTED CIRCUIT SUBSTRATE WITH SOLDER FORMED ON PAD-ON-VIA AND PAD-OFF-VIA CONTACTS THEREOF

This is a divisional of application Ser. No. 08/623,676, filed Mar. 29, 1996 now U.S. Pat. No. 5,660,321.

FIELD OF THE INVENTION

The present invention is generally directed to printed circuit board processes and products. More particularly, the invention relates to the formation of solder deposits in controlled heights and volume on printed circuit boards containing pad-on and pad-off vias.

BACKGROUND OF THE INVENTION

Various methods for electrically connecting packaged and unpackaged integrated circuits to printed circuit substrates are well known in the art. On such method uses flip-chips. A flip-chip is an unpackaged integrated circuit device whose bonding pads bear solder bumps which are substantially hemispherical-shaped. The solder bumps typically are made of a tin-lead composition.

Generally, one or more flip-chips are electrically connected to a printed circuit substrate along with other electrical devices to form an electrical circuit. One or both sides of a printed circuit substrate can be used as an active side, which has an interconnection pattern of electrically conductive material (e.g. copper) in which to interconnect the various devices used in the circuit. For the purposes of flip-chip attachment, the substrates interconnection pattern has a number of contact pads defined thereon which correspond to the location and orientation of the solder bumps on a particular flip-chip which may be attached to the printed circuit substrate. One method of connection is controlled collapse chip connection (C4) soldering which involves aligning the bumps of the flip-chip with corresponding wettable solder contacts of the substrate, and then heating the solder to induce reflow and electrical connection between the chip and substrate.

FIG. 1 shows a cross-sectional view of a typical prior art flexible printed circuit substrate 10. Substrate 10 comprises an organic epoxy core 12 and a plurality of conductive layers 14 separated by insulation layers 16. The substrate has a plurality of contact pads 18 for electrically coupling the substrate to other electronic devices, such as flip-chips. Tin-lead solder bumps 20 are generally formed on contact pads 18 to facilitate the attachment of an electrical device, such as a flip-chip, to the printed circuit board. The outermost layer of substrate 10 typically includes a permanent photoresist layer 24.

The contact pads 18, as depicted in FIG. 1, are generally known as pad-on-off via contacts since the contacts do not themselves reside in the substrate vias 22. As shown in FIG. 1, the contacts pads comprise a conductive layer 26 that connects the contacts to the substrate vias 22. Until recently, only pad-off-via have been used on flexible, epoxy printed circuit boards, mainly because of manufacturing limitations. However, the number of I/O's (inputs/outputs) on flip-chip devices has risen to a point where the exclusive use of pad-off-via contacts is impractical in some instances. The need to maximize usable substrate real estate has led to advanced manufacturing techniques that now permit the manufacture of printed circuit substrates containing both pad-off-via and pad-on-via contacts.

It is appreciated that the deposition and reflow of solder on a printed circuit substrate must be precisely controlled to control the height of the solder bumps after soldering. As is well known in the art, controlling the height of solder bumps after reflow is necessary in order to prevent the surface tension of the molten solder bumps from drawing the flip-chip excessively close to the substrate during the reflow process. Moreover, it is appreciated that controlling the height and volume of solder bumps is necessary to produce reliable electrical interconnections.

FIG. 2 illustrates a printed circuit substrate 40 containing both a pad-on-via and a pad-off-via contact 42 and 44, respectively. Since the depths of the pad-off-via and pad-on-via contacts differ, those problems associated with controlling the height and volume of the printed circuit substrate solder bumps are accentuated.

What is needed then is a low cost method for forming reliable connections between surface mounted electronic components and substrates containing both pad-off and pad-on via contacts. As will be seen, the present invention provides a method for controlling the height and volume of solder bumps on printed circuit boards containing pad-off and pad-on via contacts.

The invention provides a printed circuit substrate comprising a plurality of contact pads and solder on the contact pads. The contact pads comprise at least one pad-on-via and at least one pad-off-via. The solder has a first volume on the pad-on-via and a second volume on the pad-off-via. The volumes have surfaces, facing away from the respective vias, which are at least partially co-planar and at least partially electrically unattached.

BRIEF DESCRIPTION OF THE DRAWINGS

The present invention is illustrated by way of example and is not limited by the figures of the accompanying drawings, in which like references indicate similar elements, and in which.

DETAILED DESCRIPTION

A method for depositing solder onto the pad-on and pad-off via contacts of a substrate is described. In the following description, numerous specific details are set forth such as material types, dimensions, processing steps, etc., in order to provide a thorough understanding of the present invention. However, it will be apparent to one of skill in the art that the invention may be practiced without these specific details. In other instances, well known elements and processing techniques have not been shown in particular detail in order to avoid unnecessarily obscuring the present invention.

Figure 1:
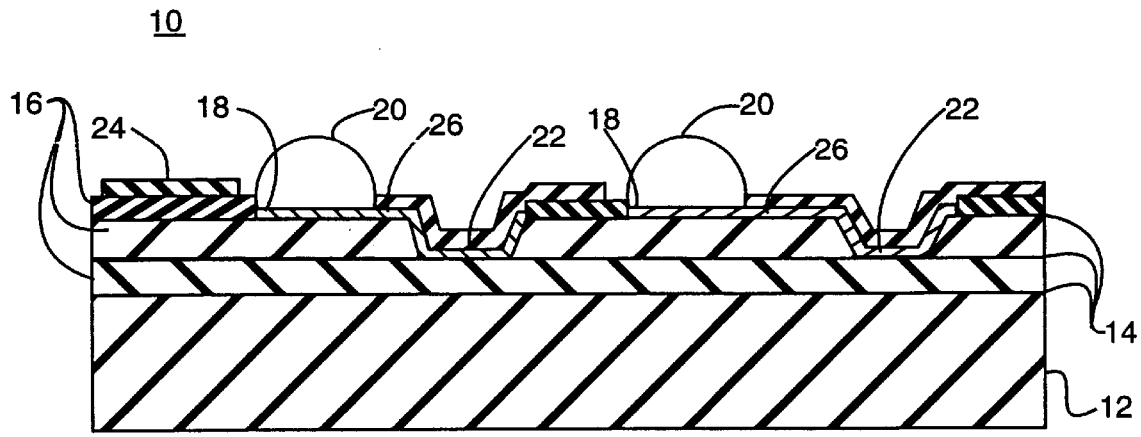
FIG. 1 illustrates a cross-sectional view of a typical prior art printed circuit substrate containing only pad-off-via contacts.
Figure 2:
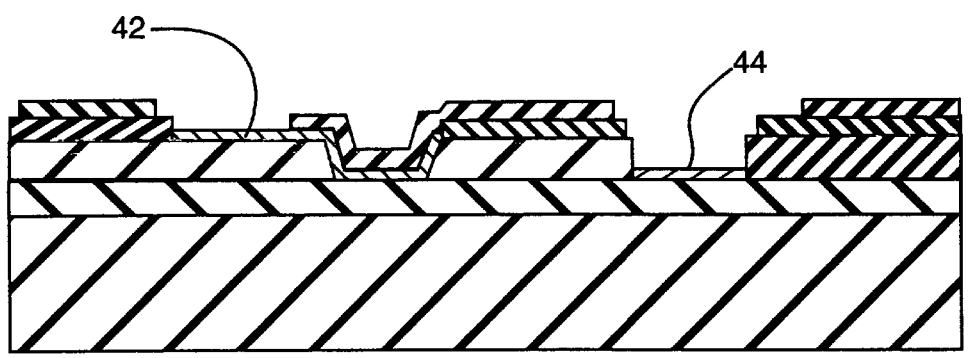
FIG. 2 illustrates a cross-sectional view of a printed circuit substrate having both pad-on-via and pad-off-via contacts.
Figure 3:
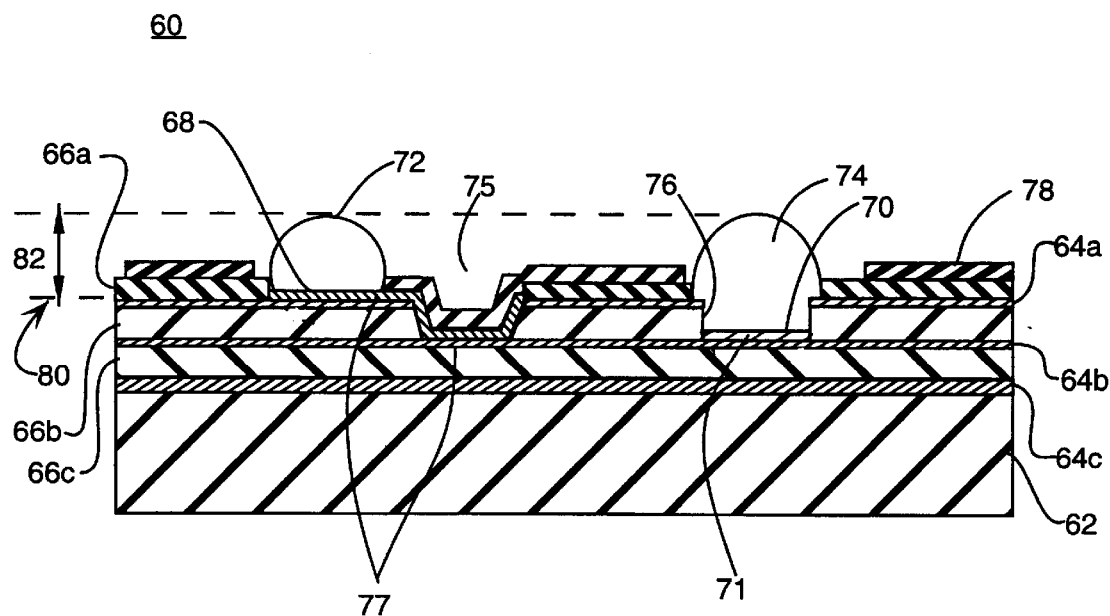
FIG. 3 illustrates a cross-sectional view of a printed circuit substrate of the present invention having solder bumps of a constant height and volume above the pad-off-via contact plane.

FIG. 3 illustrates a cross-sectional view of a printed circuit substrate 60 of the present invention. Substrate 60 typically comprises an organic epoxy core 62 and a plurality of conductive layers 64a, 64b and 64c that are separated by insulation layers 66a, 66b and 66c. The outermost layer of substrate 60 may include a permanent photoresit or other insulation layer 78. To electrically couple selective conductive layers of substrate 60 to other electrical devices, pad-off-via and pad-on-via contacts 68 and 70 are provided within the substrate structure. Pad-off-via and pad-on-via contacts typically comprise a thin copper layer that is bonded or joined to a substrate conductive layer. For example, in FIG. 3, pad-off-via contact 68 comprises a copper layer 77 that is connected to conductive layer 64b at via 75. Pad-on-via contact 70 comprises a copper layer 71 that is connected to conductive layer 64b at via 76. Note that layers 71 and 77 may comprise a material other than copper. In fact, layers 71 and 77 may comprise a multilayered metallurgy.

Figure 4A:
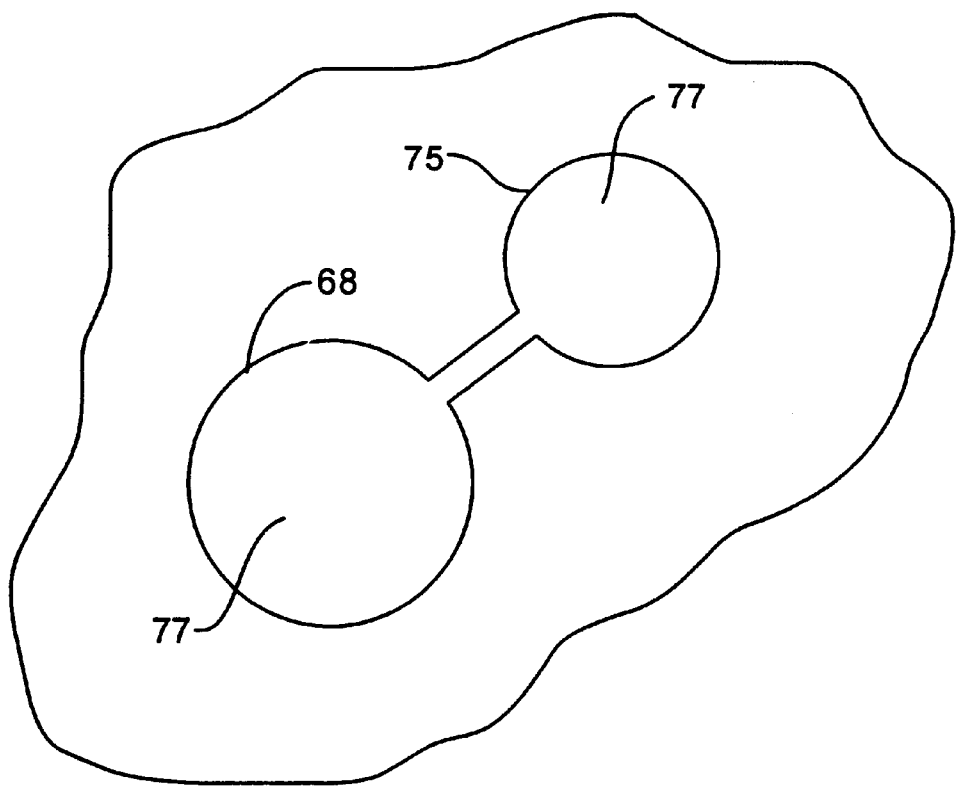
FIG. 4A illustrates a top view of a pad adjacent to a via to illustrate a pad-off-via contact.
Figure 4B:
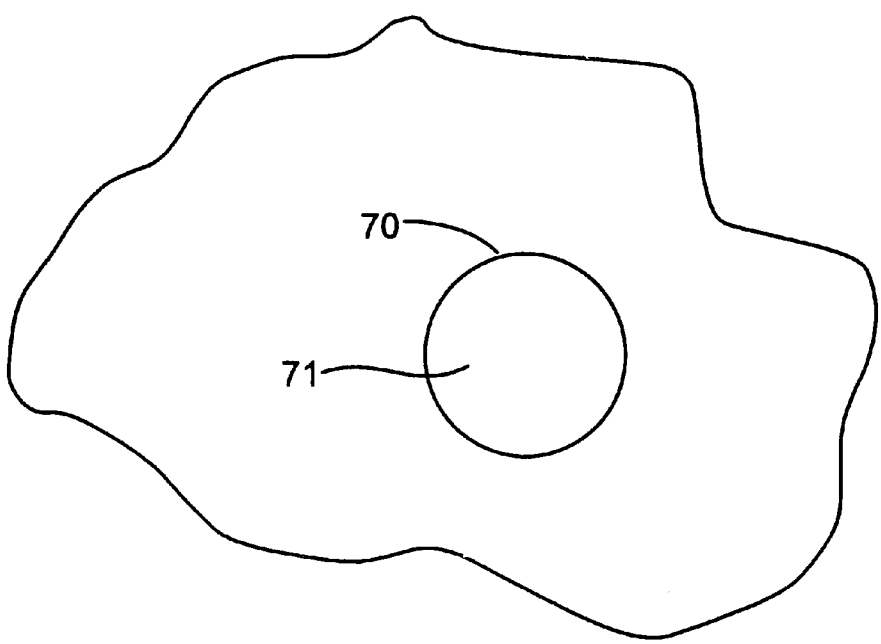
FIG. 4B illustrates a top view of a pad residing in a via to illustrate a pad-on-via contact.

FIGS. 4A and 4B show a top view of the pad-off-via contact 68 and pad-on-via contact 70 of substrate 60. As illustrated, the surface area of the contacts differ in size. In addition, as shown in FIG. 3, the depth of contacts relative to the top surface of the substrate also differ. Solder bumps 72 and 74 are formed over the pad-off-via and pad-on-via contacts 68 and 70, respectively. It is important to note that the height 82 and volume of solder bumps 72 and 74 are substantially the same as measured above a horizontal plane 80 that is co-planar to pad-off-via contact 68. Therefore, in accordance with the present invention, a reliable solder connection between the solder bumps of substrate 60 and the ball grid array of a flip-chip, or other electronic device, may be established. Although substrate 60 is shown having three conductive and three insulation layers, it is understood that the present invention is not limited by the number of conductive and insulation layers. Further, it is appreciated that the pad-off-via and pad-on-via contacts may be connected to any one of the substrate conductive layers.

In one embodiment, the diameter of contact 68 and 70 is approximately 140 and 100 microns, respectively. The depth of pad-off-via contact 68, as measured from the top of surface layer 78 to the top of copper layer 77, is approximately 10–30 microns. The depth of pad-on-via contact 70, as measured from the top of layer 78 to the top of copper layer 71, is approximately 50–70 microns. The thickness of copper layers 71 and 77 is approximately 15 microns.

As previously discussed, flip-chip and other electronic devices are routinely surface mounted to printed circuit substrates. One method of attachment is controlled collapse chip connection (C4) soldering which involves aligning the bumps of the flip-chip with corresponding solder bumps on the substrate. In order to establish a reliable electrical connection between the flip-chip and substrate, it is important that solder be deposited onto the pad-off and pad-on via contacts such that the height of the substrate solder bumps are relatively constant along the surface of the substrate. Moreover, it is important to deposit solder onto the substrate contacts such that the volume of solder, as measured above a plane that is co-planar to the pad-off-via contact, is relatively constant.

Figure 5:
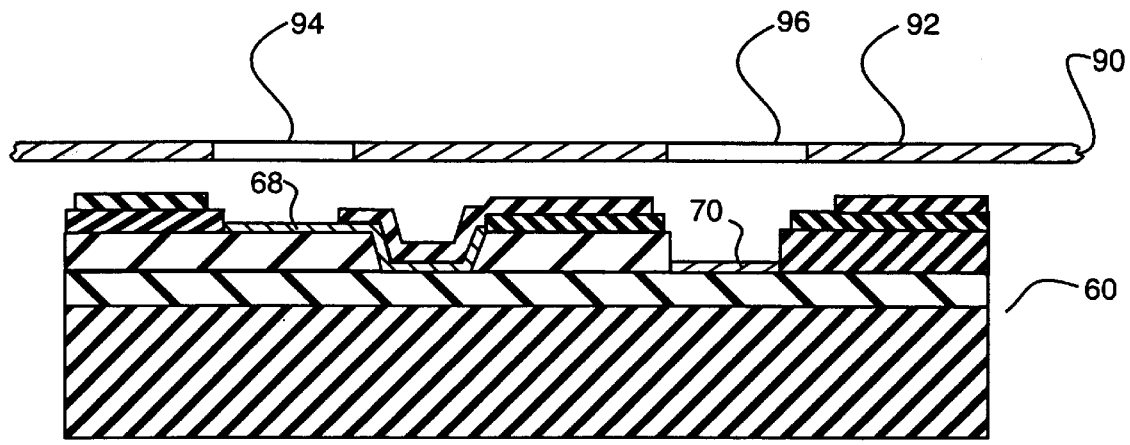
FIG. 5 illustrates the substrate and solder mask apparatus configuration of one embodiment of the present invention before solder paste is applied over the electrical contact pads of the substrate.
Figure 6:
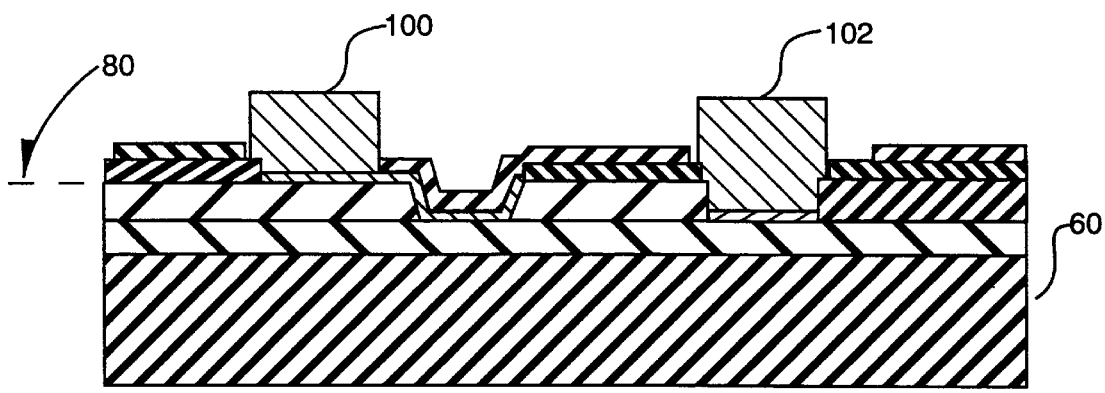
FIG. 6 represents the substrate illustrated in FIG. 5 after solder paste is applied to the pad-on-via and pad-off-via contacts.

As depicted in FIGS. 5 and 6, solder is deposited onto pad-off and pad-on via contacts 68 and 70 by first positioning a solder mask apparatus 90 over substrate 60 such that mask openings 94 and 96 are aligned with the substrate contact locations. In one embodiment, openings 94 and 96 are circular in shape and have diameters of approximately 170 and 180 microns, respectively. The thickness of mask 90 is approximately 100 microns. When mask apparatus 90 is in place, solder paste is dispensed onto the top surface 92 of apparatus 90 and then concurrently forced through mask openings 94 and 96 onto contacts 68 and 70 by the use of a squeegee or some other device. The amount of solder paste dispensed through openings 94 and 96 is approximately $2.27 \times 10^{-3}$ mm$^3$ and $2.54 \times 10^{-3}$ mm$^3$, respectively. FIG. 6 shows a cross-sectional view of substrate 60 after solder 100 and 102 has been applied to contacts 68 and 70. Solder 100 and 102 may comprise any solder material whose properties are conducive to the process just described. For example, the solder may comprise a 97/3 Pb/Sn or 95/5 Pb/Sn composition. Solder bumps 72 and 74, as depicted in FIG. 3, are formed by reflowing solder 100 and 102 at a temperature of approximately 350 degrees Celsius. The height of solder bumps 72 and 74 is approximately 60 microns as measured from horizontal plane 80 after reflow.

Figure 7:
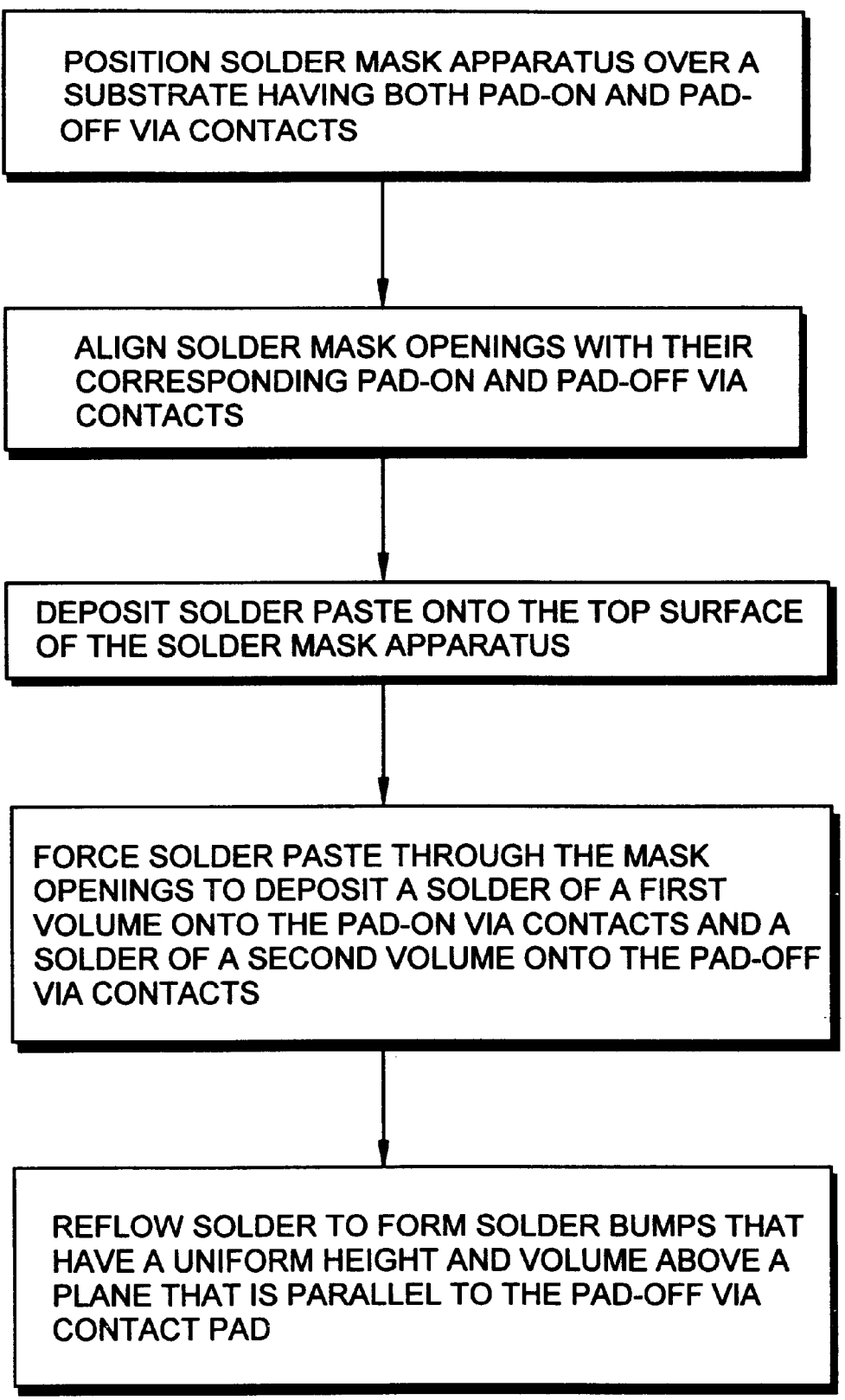
FIG. 7 illustrates one flow chart for making a printed circuit substrate according to the invention.

FIG. 7 illustrates a flow chart of the solder deposition process for making a printed circuit substrate according to the invention.

Figure 8:
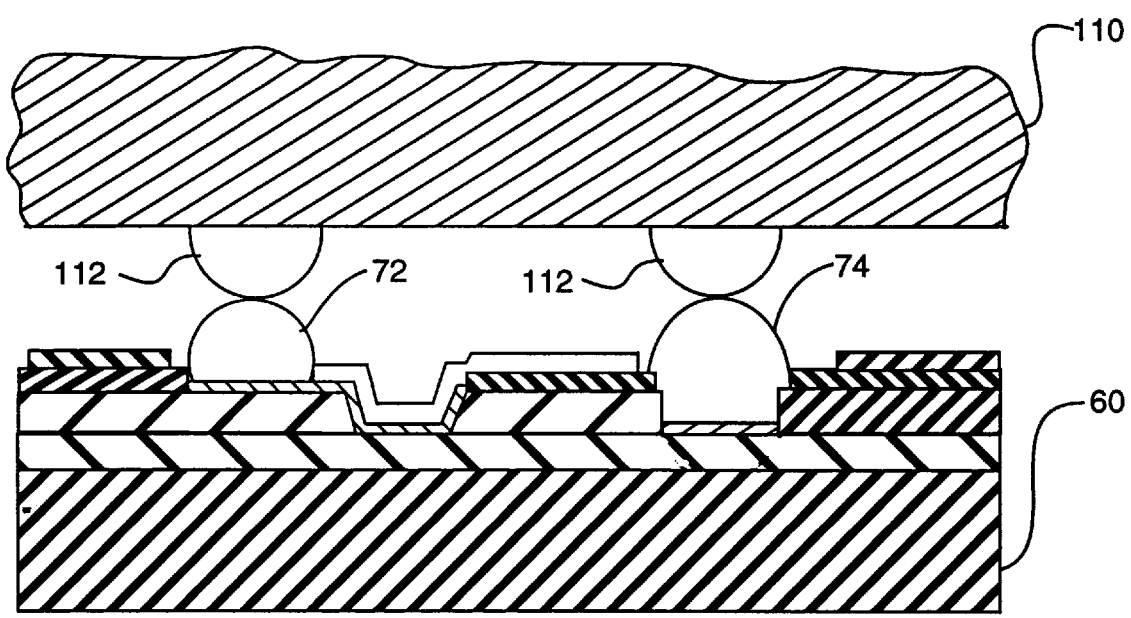
FIG. 8 illustrates another embodiment of the present invention wherein an electronic device is attached to a printed circuit substrate having both pad-on and pad-off via contacts.
Figure 9:
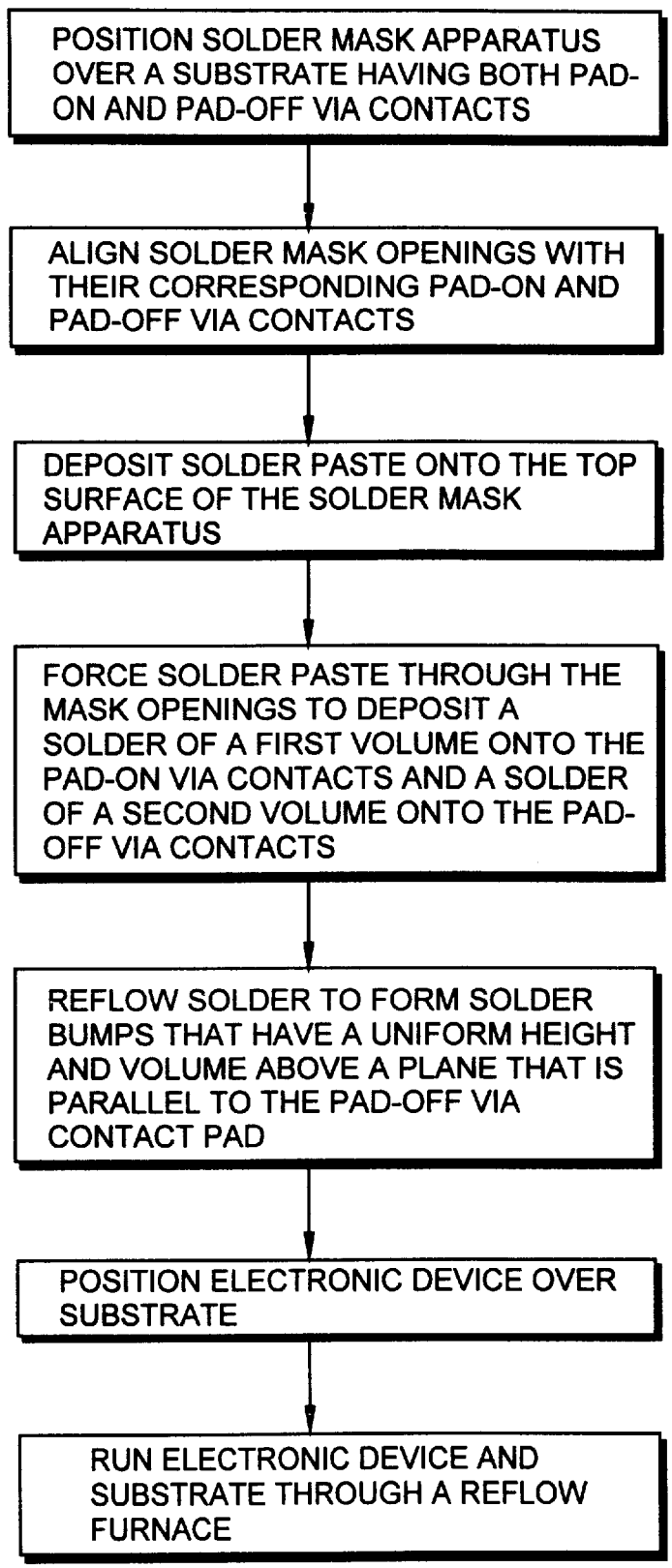
FIG. 9 illustrates another flow chart for making a printed circuit substrate according to the invention.

An electronic device 110, such as a flip-chip, may be attached to substrate 60 by aligning the ball grid array bumps 112 of device 110 with the solder bumps of substrate 60, as depicted in FIG. 8, and running the unit through a reflow furnace. In an embodiment wherein the solder bumps of device 110 and substrate 60 comprise 97/3 Pb/Sn, the reflow furnace temperature is set at approximately 350 degrees Celsius. FIG. 9 illustrates a flow chart of the connection process for forming a printed circuit substrate according to the invention.

It is appreciated that the methods and apparatus of the present invention may be used in other technologies to form electrical and/or mechanical connections between other types of electrical devices. It is further understood that the relative dimensions, geometric shapes, materials and process parameters set forth within the specification are exemplary of the disclosed embodiments only. Other embodiments may utilize different dimensions, shapes, materials, and process settings, etc., to achieve substantially the same results.

What is claimed is:

1. A printed circuit substrate, comprising:
   a multilayer substrate;
   at least one pad-on-via contact on the multilayer substrate;
   at least one pad-off-via contact on the multilayer substrate, wherein said pad-on-via contact is at a lower height from the bottom of the substrate than said pad-off-via contact;
   a first solder bump formed on said pad-on-via contact, said first solder bump having a first exposed surface on a side thereof opposing said pad-on-via contact; and
   a second solder bump formed on said pad-off-via contact, said second solder bump having a second exposed surface on a side thereof opposing said pad-off-via contact, the first and second exposed surfaces being at substantially the same height from the bottom of the substrate so as to be capable of establishing a solder connection with an electronic device having contacts at the same height.

2. The printed circuit substrate of claim 1 wherein said solder comprises 97/3 Pb/Sn.

3. The printed circuit substrate of claim 1 wherein said pad-on-via contact has a depth of approximately 50–70 microns.

4. The printed circuit substrate of claim 1 wherein said pad-off-via contact has a depth of approximately 10–30 microns.

* * * * *